(12) United States Patent
Ching et al.

(10) Patent No.: US 9,837,537 B2
(45) Date of Patent: Dec. 5, 2017

(54) SEMICONDUCTOR DEVICE AND FORMATION THEREOF

(71) Applicant: Taiwan Semiconductor Manufacturing Company Limited, Hsin-Chu (TW)

(72) Inventors: Kuo-Cheng Ching, Zhubei (TW); Guan-Lin Chen, Hsin-Chu (TW); Chao-Hsiung Wang, Hsin-Chu (TW); Chi-Wen Liu, Hsinchu (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 55 days.

(21) Appl. No.: 14/181,800

(22) Filed: Feb. 17, 2014

(65) Prior Publication Data

US 2015/0236114 A1 Aug. 20, 2015

(51) Int. Cl.
*H01L 29/78* (2006.01)
*H01L 29/40* (2006.01)
*H01L 29/417* (2006.01)
*H01L 27/12* (2006.01)
*H01L 21/84* (2006.01)
*H01L 29/66* (2006.01)

(52) U.S. Cl.
CPC .......... *H01L 29/785* (2013.01); *H01L 21/845* (2013.01); *H01L 27/1211* (2013.01); *H01L 29/401* (2013.01); *H01L 29/41783* (2013.01); *H01L 29/41791* (2013.01); *H01L 29/66795* (2013.01)

(58) Field of Classification Search
CPC ............. H01L 29/41791; H01L 29/785; H01L 27/1211; H01L 21/845; H01L 29/7848; H01L 29/511; H01L 29/7849; H01L 29/41783
USPC ......................................................... 438/300
See application file for complete search history.

(56) References Cited

U.S. PATENT DOCUMENTS

| | | | |
|---|---|---|---|
| 8,310,013 B2 * | 11/2012 | Lin et al. ........................ 257/401 |
| 8,901,607 B2 | 12/2014 | Wang et al. |
| 9,006,786 B2 | 4/2015 | Ching et al. |
| 9,153,692 B2 * | 10/2015 | Kim .................... H01L 29/7848 |
| 9,196,522 B2 * | 11/2015 | Ching ............... H01L 21/76205 |
| 2007/0241399 A1 * | 10/2007 | Irisawa et al. ................ 257/347 |
| 2010/0252862 A1 * | 10/2010 | Ko et al. ........................ 257/192 |
| 2010/0276761 A1 * | 11/2010 | Tung et al. .................... 257/384 |
| 2011/0117679 A1 * | 5/2011 | Lee et al. .......................... 438/5 |
| 2011/0193141 A1 * | 8/2011 | Lin et al. ....................... 257/255 |
| 2013/0043511 A1 * | 2/2013 | Tsai .................. H01L 21/26506 257/288 |
| 2013/0234203 A1 * | 9/2013 | Tsai .................. H01L 29/66795 257/190 |
| 2013/0249006 A1 * | 9/2013 | Khakifirooz et al. ........ 257/368 |

(Continued)

*Primary Examiner* — Michael Trinh
(74) *Attorney, Agent, or Firm* — Cooper Legal Group, LLC

(57) ABSTRACT

A semiconductor device and method of formation are provided herein. A semiconductor device includes a barrier including carbon over a fin, the fin including a doped region. The semiconductor device includes an epitaxial (Epi) cap over the barrier, the Epi cap including phosphorus. The barrier inhibits phosphorus diffusion from the Epi cap into the fin as compared to a device that lacks such a barrier. The inhibition of the phosphorus diffusion reduces a short channel effect, thus improving the semiconductor device function.

14 Claims, 10 Drawing Sheets

(56) References Cited

U.S. PATENT DOCUMENTS

| | | | |
|---|---|---|---|
| 2013/0270638 A1* | 10/2013 | Adam | H01L 29/66795 257/347 |
| 2013/0288456 A1* | 10/2013 | Lai et al. | 438/478 |
| 2014/0035000 A1* | 2/2014 | Ontalus | H01L 29/665 257/192 |
| 2014/0042500 A1* | 2/2014 | Wann et al. | 257/288 |
| 2014/0065774 A1* | 3/2014 | Chang et al. | 438/157 |
| 2014/0151761 A1* | 6/2014 | Hsieh et al. | 257/288 |
| 2014/0167163 A1* | 6/2014 | Cheng et al. | 257/347 |
| 2014/0197457 A1 | 7/2014 | Wang et al. | |
| 2014/0197493 A1* | 7/2014 | Tsai et al. | 257/368 |
| 2014/0231872 A1* | 8/2014 | Colinge | H01L 29/66795 257/192 |
| 2014/0264348 A1* | 9/2014 | Tsai | C30B 25/165 257/57 |
| 2014/0264445 A1* | 9/2014 | Xiao | 257/192 |
| 2014/0264592 A1* | 9/2014 | Oxland | H01L 29/785 257/347 |
| 2014/0346600 A1* | 11/2014 | Cheng et al. | 257/347 |
| 2015/0021625 A1* | 1/2015 | Utomo | H01L 29/785 257/77 |
| 2015/0028426 A1* | 1/2015 | Ching | H01L 29/785 257/401 |
| 2015/0035074 A1* | 2/2015 | Obradovic et al. | 257/369 |
| 2015/0102393 A1* | 4/2015 | Mieno | H01L 29/66795 257/288 |
| 2015/0108544 A1* | 4/2015 | Ching | H01L 21/823821 257/192 |
| 2015/0144999 A1* | 5/2015 | Ching | H01L 29/66795 257/190 |
| 2015/0171193 A1* | 6/2015 | Cheng | H01L 21/82343 438/197 |

\* cited by examiner

SEMICONDUCTOR DEVICE AND FORMATION THEREOF

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
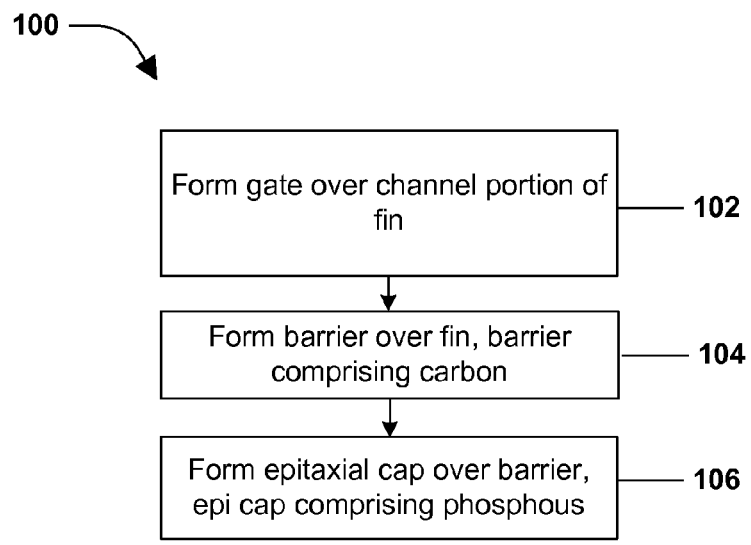
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 2:
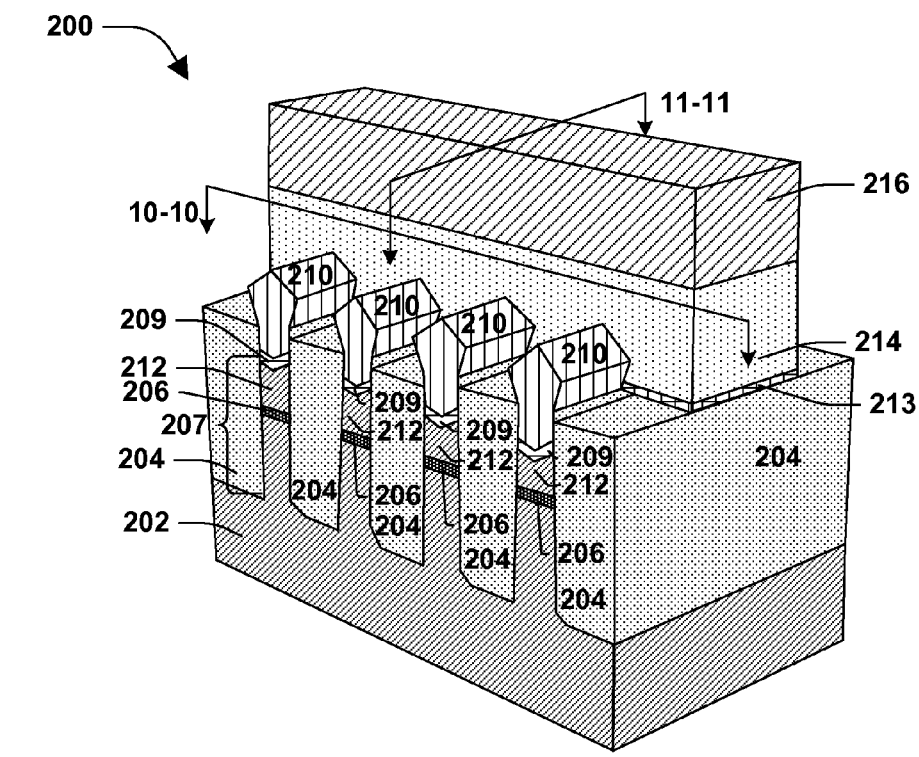
FIG. 2 is an illustration of a semiconductor device, in accordance with some embodiments.
Figure 3:
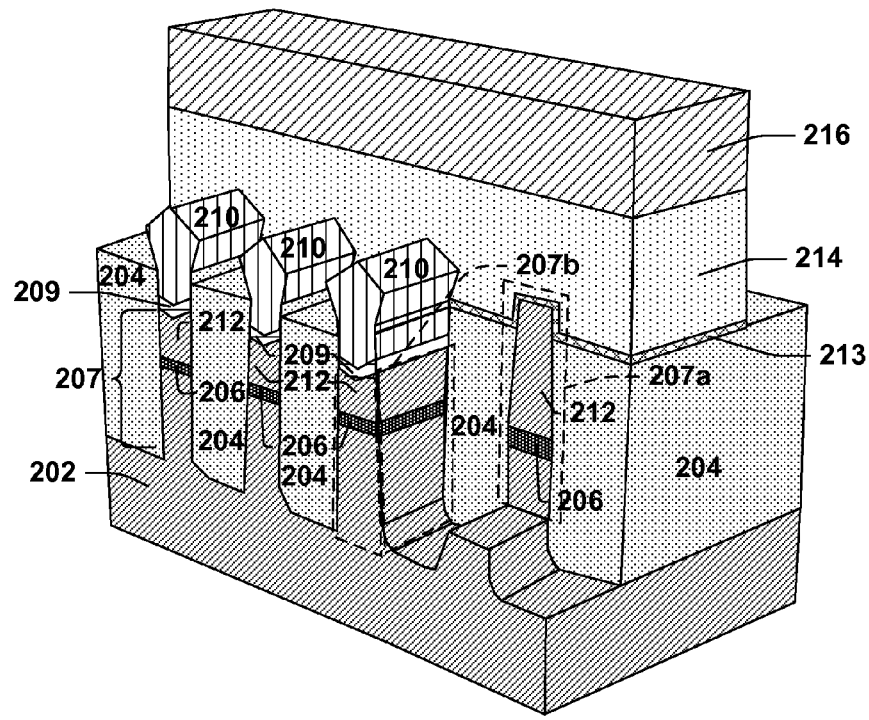
FIG. 3 is an illustration of a semiconductor device, in accordance with some embodiments.
Figure 5:
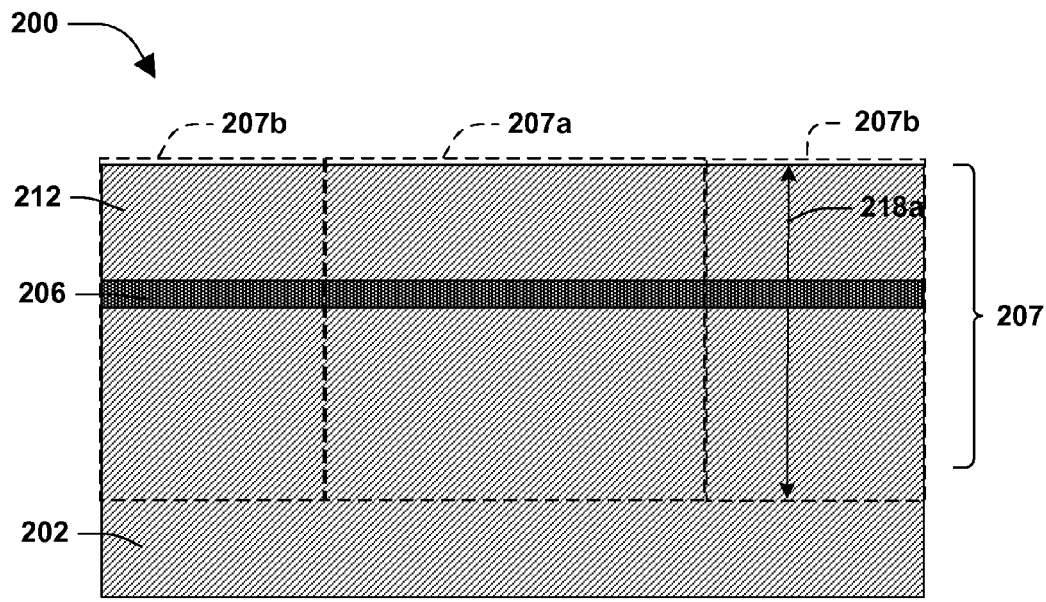
FIG. 5 is an illustration of a semiconductor device, in accordance with some embodiments.
Figure 6:
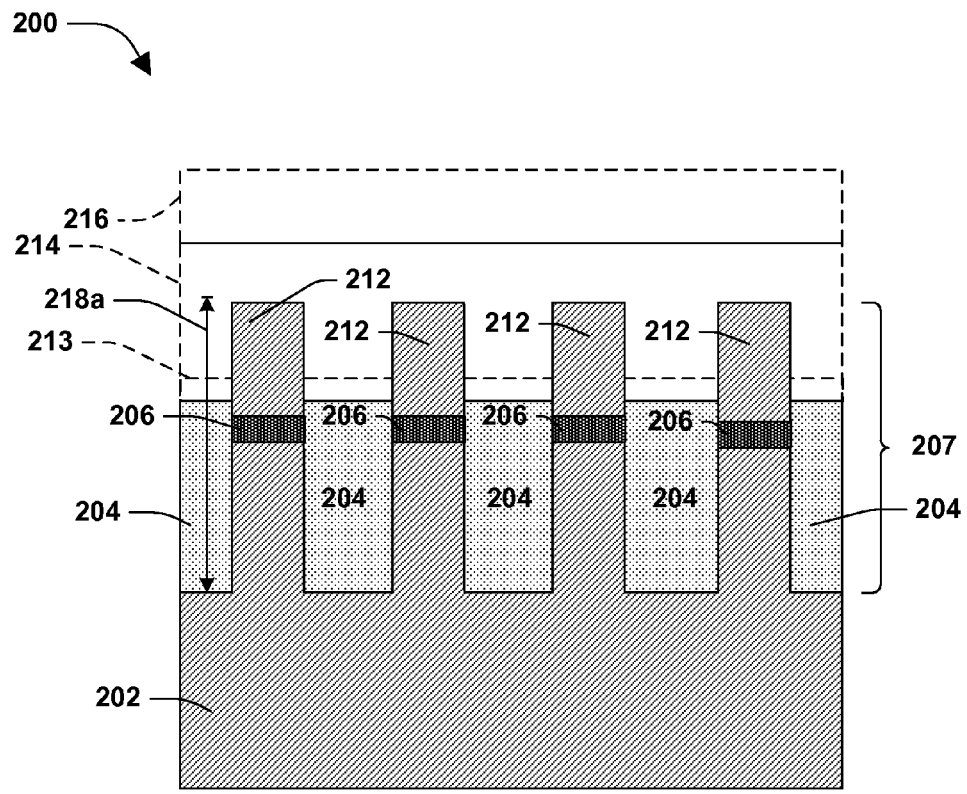
FIG. 6 is an illustration of a semiconductor device, in accordance with some embodiments.
Figure 7:
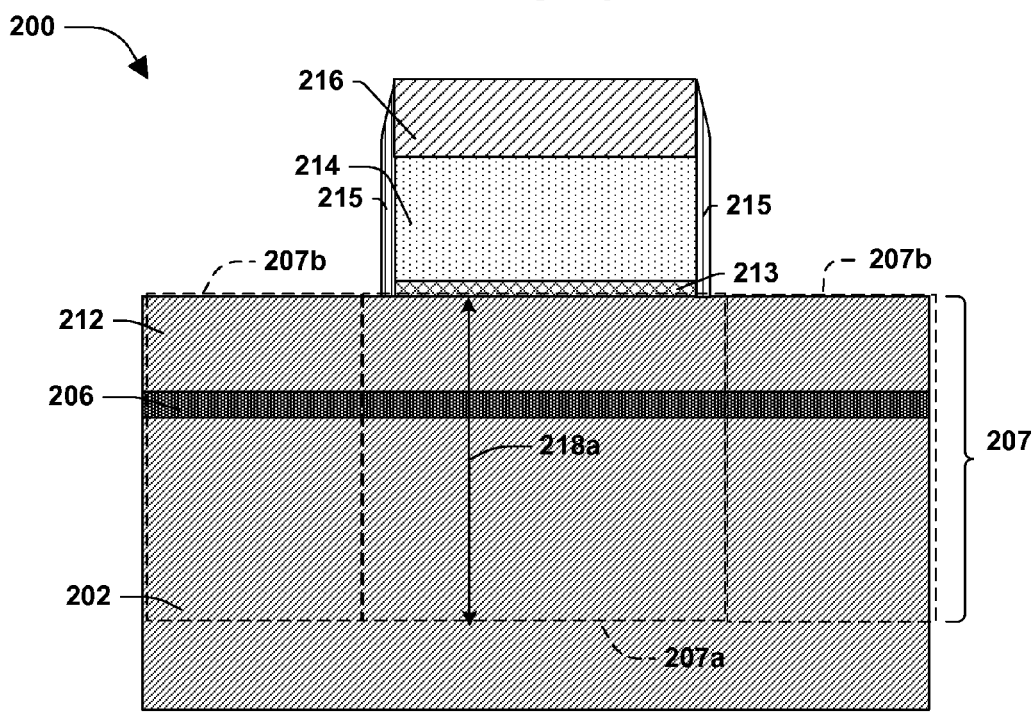
FIG. 7 is an illustration of a semiconductor device, in accordance with some embodiments.
Figure 8:
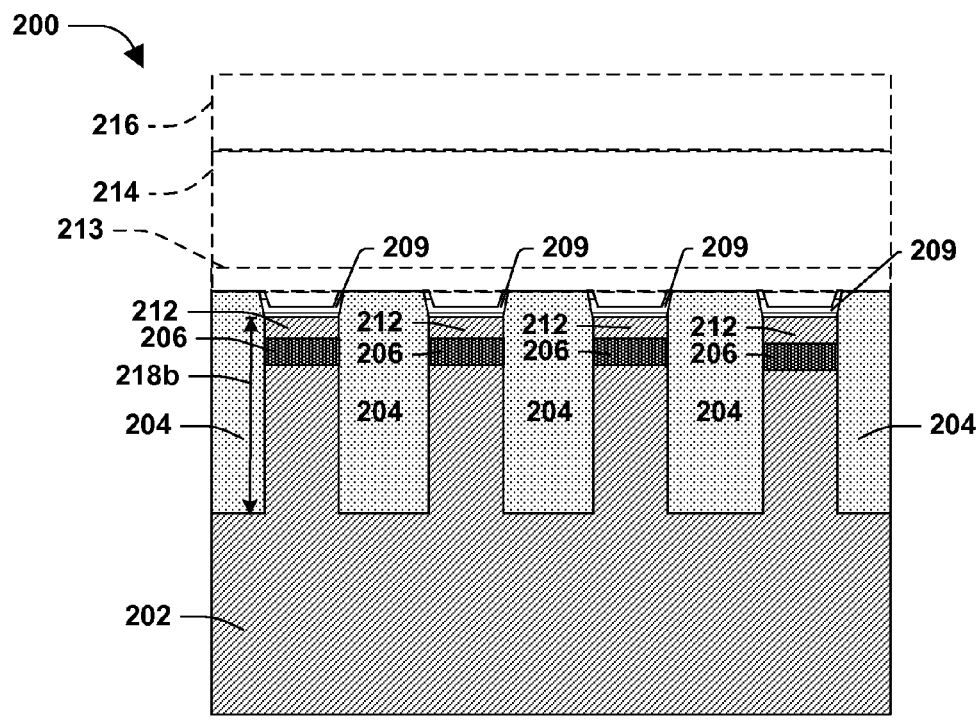
FIG. 8 is an illustration of a semiconductor device, in accordance with some embodiments.
Figure 9:
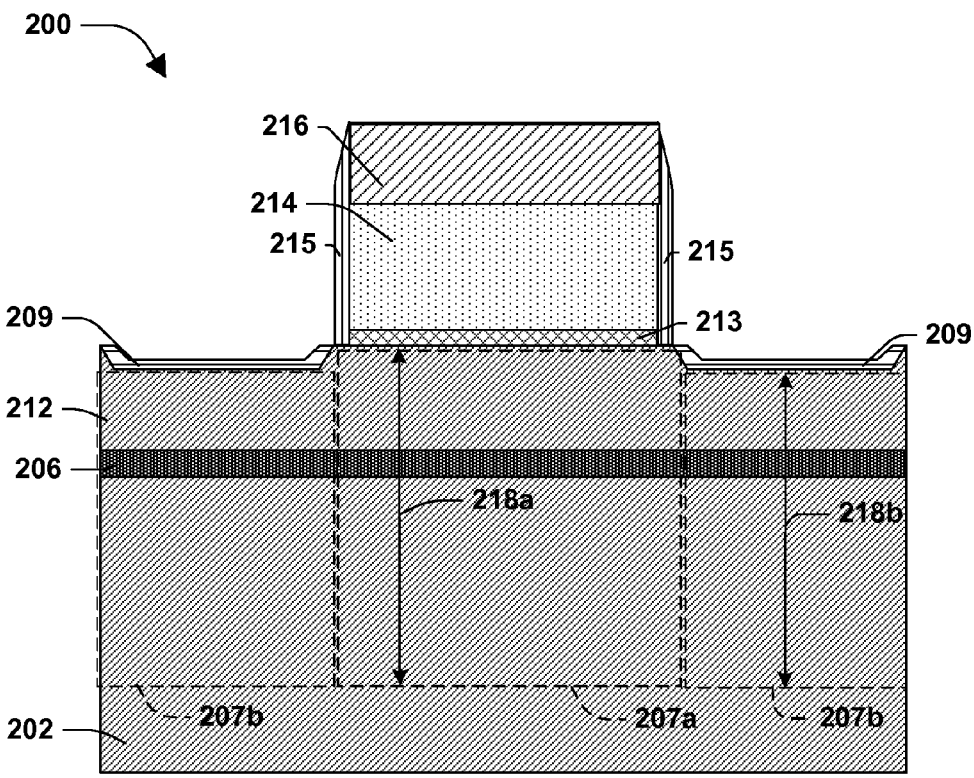
FIG. 9 is an illustration of a semiconductor device, in accordance with some embodiments.
Figure 10:
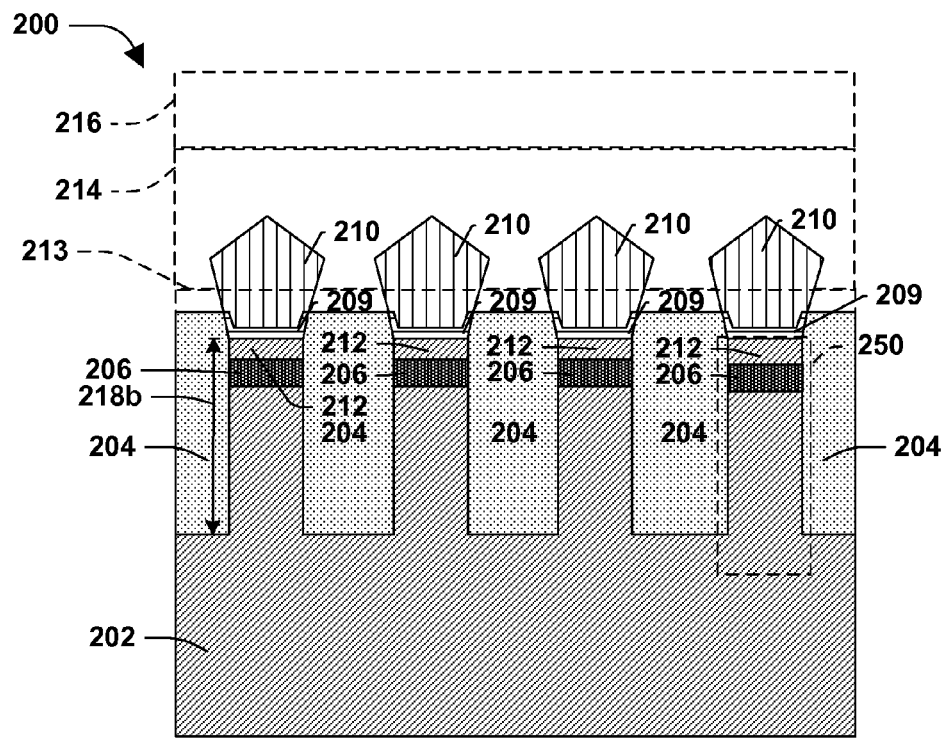
FIG. 10 is an illustration of a semiconductor device, in accordance with some embodiments.
Figure 11:
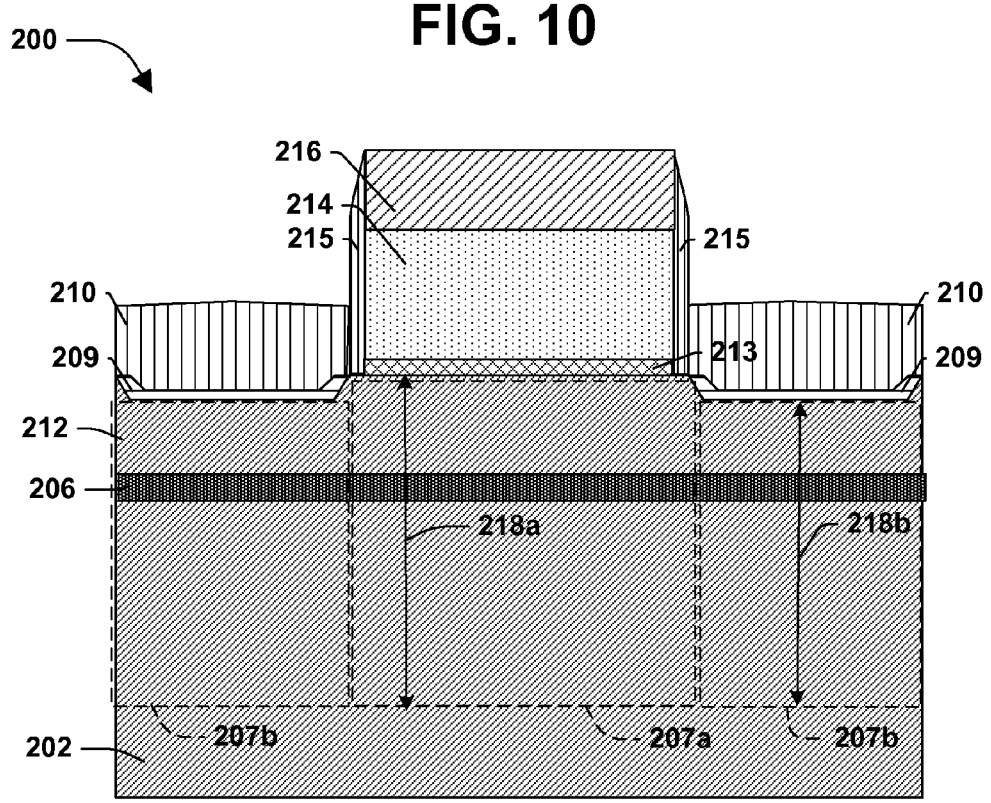
FIG. 11 is an illustration of a semiconductor device, in accordance with some embodiments.

A method 100 of forming a semiconductor device 200 according to some embodiments is illustrated in FIG. 1 and one or more structures formed thereby at various stages of fabrication are illustrated in FIGS. 2-11. In FIGS. 2-3, which illustrate 3D renderings of the semiconductor device 200, according to some embodiments, sidewalls 215, as illustrated in FIGS. 7, 9 and 11 are not shown, so that features underlying the sidewalls 215 are visible. In some embodiments, STI 204 is adjacent a fin 207, and a barrier 209 comprising carbon is over a non-channel portion 207b of the fin 207, as illustrated in FIG. 3, where four instances of the fin 207 are illustrated in FIG. 3. In some embodiments, an epitaxial (Epi) cap 210 comprising phosphorus is over the barrier 209. In some embodiments, the barrier 209 inhibits phosphorus diffusion from the Epi cap 210 into the fin 207 as compared to a device that lacks such a barrier. In some embodiments, the inhibition of the phosphorus diffusion from the Epi cap 210 to the fin 207 reduces a short channel effect, thus improving the semiconductor device 200 function. In some embodiments, a gate dielectric 213 is formed over a channel portion 207a of the fin 207. In some embodiments, a gate 214 is formed over the gate dielectric 213, and a hard mask 216 is formed over the gate 214. In some embodiments, the fin 207 comprises a doped region 206. In FIG. 2, a line 10-10 is drawn to illustrate a cross-section that is depicted in FIG. 10, according to some embodiments. In FIG. 2, a line 11-11 is drawn to illustrate a cross-section that is depicted in FIG. 11, according to some embodiments. In some embodiments, the line 10-10, cuts through the Epi cap 210, the barrier 209 and the non-channel portion 207b of the four instances of the fin 207. FIGS. 4, 6, 8 and 10 are cross sectional views of the semiconductor device 200 taken along the line 10-10 at various stages of fabrication. In some embodiments, the line 11-11, cuts through the hard mask 216, the gate 214, the gate dielectric 213, the Epi cap 210, the barrier 209, the non-channel portion 207b of the fin 207, and the channel portion 207a of one of the instances of the fin 207. FIGS. 5, 7, 9 and 11 are cross sectional views of the semiconductor device 200 taken along the line 11-11 at various stages of fabrication.

Figure 4:
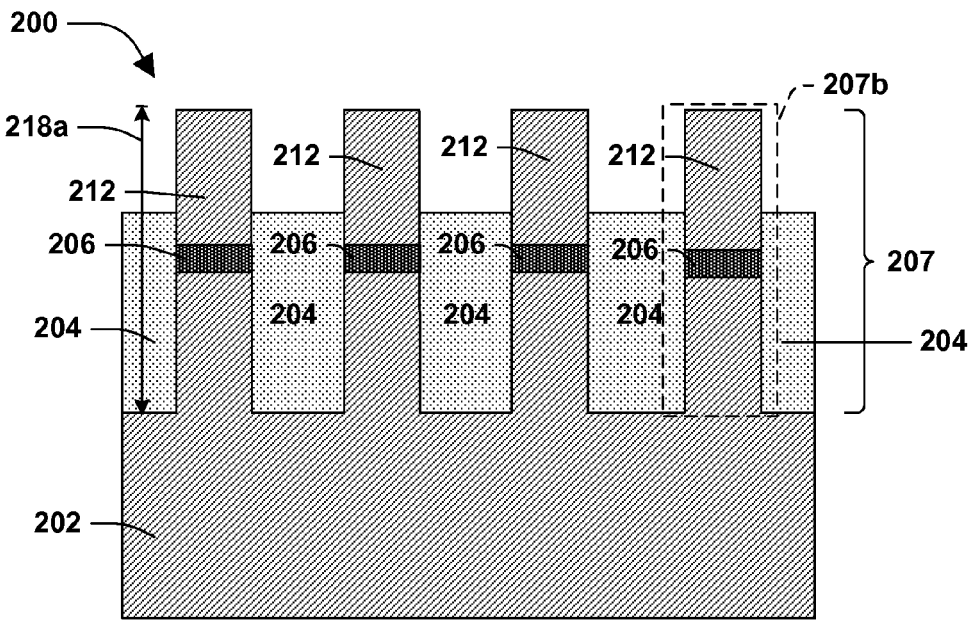
FIG. 4 is an illustration of a semiconductor device, in accordance with some embodiments.

At 102 of method 100, a gate 214 is formed over the channel portion 207a of the fin 207, as illustrated in FIGS. 6-7, according to some embodiments. Turning to FIGS. 4-5, prior to FIGS. 6-7, the fin 207 comprising a doped region 206 is over and comprises a portion of a substrate 202, according to some embodiments. In some embodiments, the substrate 202 comprises silicon. According to some embodiments, the substrate 202 comprises at least one of an epitaxial layer, a silicon-on-insulator (SOI) structure, a wafer, or a die formed from a wafer. In some embodiments, the substrate 202 comprises at least one of a first conductivity type or a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the doped region 206 is grown. In some embodiments, the doped region 206 comprises at least one of silicon, oxide or germanium. In some embodiments, a second substrate layer 212 is over the doped region 206. In some embodiments, the second substrate layer 212 comprises silicon. In some embodiments, the second substrate layer 212 comprises at least one of the first conductivity type or the second conductivity type. In some embodiments, the second substrate layer 212 has a second substrate height between about 40 nm to about 100 nm. In some embodiments, a first fin height 218a is between about 140 nm to about 260 nm. In some embodiments, STI 204 is between the instances of the fins 207, such that the STI 204 is on a surface of the substrate 202, a surface of the doped region 206 and on at least a portion of a surface of the second substrate layer 212. In some embodiments, the STI 204 comprises a high dielectric constant material, such as oxide. In some embodiments, the STI 204 has an STI height, the STI height less than the first fin height 218a.

According to some embodiments, forming the gate 214 comprises forming, such as by deposition, a gate dielectric layer 213 over the fins 207 and the STI 204. In some embodiments, the gate dielectric layer 213 comprises a high dielectric constant material. In some embodiments, a gate material is deposited over the gate dielectric layer 213. In some embodiments, the gate material comprises a conductive material, such as metal or polysilicon. In some embodiments, a hard mask 216 is formed over the gate material and is patterned such that the hard mask 216 is over the channel portion 207a of the fin 207, as illustrated in FIGS. 2, 3, 6 and 7. In some embodiments, the hard mask 216 comprises oxide. In some embodiments, the gate material and the gate dielectric layer 213 are patterned, with the patterned hard mask serving as a protective masking layer, such that a gate 214 is formed over the channel portion 207a of the fin 207, as illustrated in FIGS. 2, 3, 6 and 7, where the gate 214 is, on occasion, regarded as comprising the gate dielectric layer 213 as well as and gate material over the channel portion 207a. In some embodiments, sidewalls 215 are formed on a first side of the gate dielectric layer 213 and the gate 214 and on a second side of the gate dielectric layer 213 and the gate 214. In some embodiments, such as illustrated in FIG. 6, the gate dielectric layer 213, the gate 214 and the hard mask 216 are illustrated in phantom with dashed lines, because the gate dielectric layer 213, the gate 214 and the hard mask 216 are behind a plane depicted by solid lines.

At 104, a barrier 209 is formed over the non-channel portion 207b of the fin 207, as illustrated in FIGS. 2, 3, 8 and 9, according to some embodiments. In some embodiments, the barrier 209 comprises carbon. In some embodiments, prior to forming the barrier 209, the first fin height 218a, as illustrated in FIGS. 6 and 7, of the non-channel portion 207b of the fin 207 is reduced to a second fin height 218b. In some embodiments, the second fin height 218b of the non-channel portion 207b of the fin 207 is between about 80 nm to about 200 nm. In some embodiments, the first fin height 218a is reduced to the second fin height 218b by etching, such as dry etching. In some embodiments, the first fin height 218a is reduced such that the non-channel portion 207b of the fin 207 is at least one of below a top surface of the STI 204, even with the top surface of the STI 204, or above the top surface of the STI 204. In some embodiments, the barrier 209 is grown, such as by epitaxial growth, over the non-channel portion 207b of the fin 207. In some embodiments, the barrier 209 comprises a first barrier layer comprising carbon and at least one of silicon or phosphorus. In some embodiments, the first barrier layer comprises between about 0.2% to about 3% carbon. In some embodiments, the first barrier layer comprises between about $1E^{20}$ atom/cm$^3$ to about $5E^{20}$ atom/cm$^3$ of phosphorus. In some embodiments, the barrier 209 comprising the first barrier layer has a thickness between about 2 nm to about 25 nm. In some embodiments, the barrier 209 comprises the first barrier layer and a second barrier layer. In some embodiments, the first barrier layer is over the second barrier layer, such that the second barrier layer is in contact with the fin 207. In some embodiments, the first barrier layer comprises carbon and silicon. In some embodiments, the second barrier layer comprises carbon, silicon and phosphorus. In some embodiments, the first barrier layer and the second barrier layer comprise between about 0.2% to about 3% carbon. In some embodiments, the second barrier layer comprises between about $1E^{20}$ atom/cm$^3$ to about $5E^{20}$ atom/cm$^3$ of phosphorus. In some embodiments, the first barrier layer has a thickness between about 1 nm to about 24 nm. In some embodiments, the second barrier layer has a thickness between about 1 nm to about 24 nm. In some embodiments, the first barrier layer and the second barrier layer have different thicknesses.

At 106, the Epi cap 210 is formed over the barrier 209, such as illustrated in FIGS. 2, 3, 10 and 11, according to some embodiments. In some embodiments, the Epi cap 210 is adjacent the gate 214. In some embodiments, the Epi cap 210 is grown, such as by epitaxial growth. In some embodiments, the Epi cap 210 is formed over the first barrier layer, such as when there is only one barrier layer or when there are two barrier layers. In some embodiments, the Epi cap 210 comprises at least one of a source or a drain. In some embodiments, the Epi cap 210 comprises carbon and at least one of silicon or germanium. In some embodiments, the Epi cap 210 comprises at least one of the first conductivity type or the second conductivity type. In some embodiments, the Epi cap 210 has an Epi cap height measured from a top most portion of the Epi cap 210 to a top surface of the fin 207. In some embodiments, the Epi cap height is between about 20 nm to about 60 nm. In some embodiments, the barrier 209 inhibits phosphorus diffusion from the Epi cap 210 into the fin 207 as compared to a device that lacks such a barrier. In some embodiments, the inhibition of the phosphorus diffusion from the Epi cap 210 to the fin 207 reduces a short channel effect, thus improving the semiconductor device 200 function.

Figure 12:
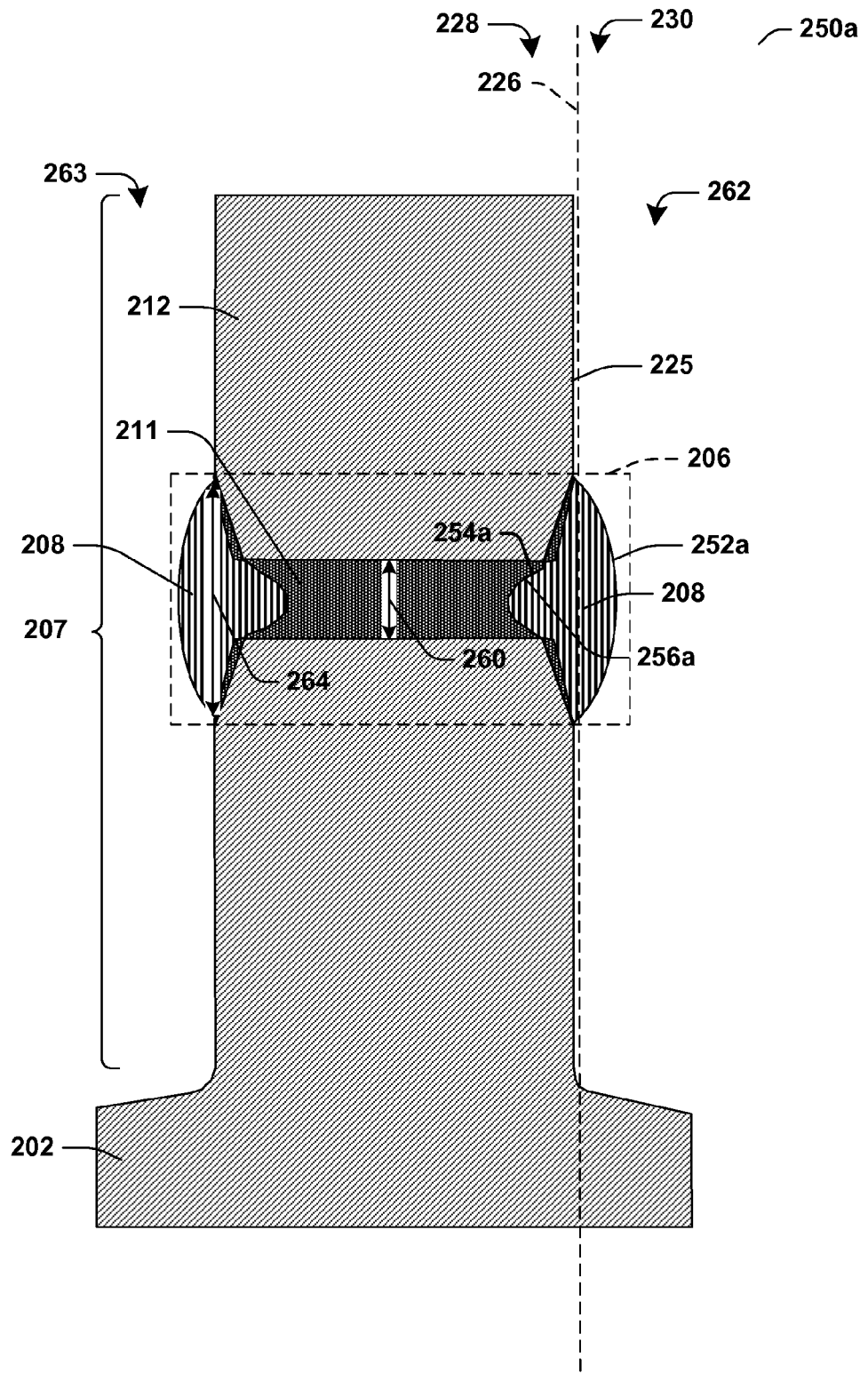
FIG. 12 is an illustration of a semiconductor device, in accordance with some embodiments.

According to some embodiments, FIG. 12 illustrates a first magnified fin 250a, the first magnified fin 250a illustrates an embodiment of the fin 207 encompassed by a dashed box 250 illustrated in FIG. 10. In some embodiments, the doped region 206 comprises a first doped area 211 and a dielectric 208. In some embodiments, the fin 207 has a first wall 225 extending along a first plane 226 on a first side 262 of the fin 207. In some embodiments, the dielectric 208 comprises oxide and at least one of silicon or germanium. In some embodiments, the first doped area 211 comprises at least one of silicon or germanium. In some embodiments, the first magnified fin 250a comprises the dielectric 208 covering a first outside surface 254a of the first doped area 211. In some embodiments, a first outer wall 252a of the dielectric 208 is on a second side 230 of the first plane 226. In some embodiments, the first outer wall 252a of the dielectric 208 is convex. In some embodiments, convex means a configuration comprising an external angle greater than about 180°, where the angle is measured relatives to any two coordinates of the configuration, such as any two coordinates of the first outer wall 252a. In some embodiments, the first outside surface 254a of the first doped area 211 is concave, such that the first outside surface 254a extends away from the first plane 226 on a first side 228 of the first plane 226. In some embodiments, a first inside surface 256a of the dielectric 208 in contact with the first outside surface 254a of the first doped area 211 is concave. In some embodiments, a second side 263 the fin 207 has substantially the same composition as or is substantially symmetrical with the first side 262 of the fin 207. In some embodiments, the dielectric 208 has a dielectric height 264, the dielectric height 264 measured from a top most point of the dielectric 208 to a bottom most point of the dielectric 208. In some embodiments, the first doped area 211 has a doped area height 260, the doped area height 260 less than the dielectric height 264.

Figure 13:
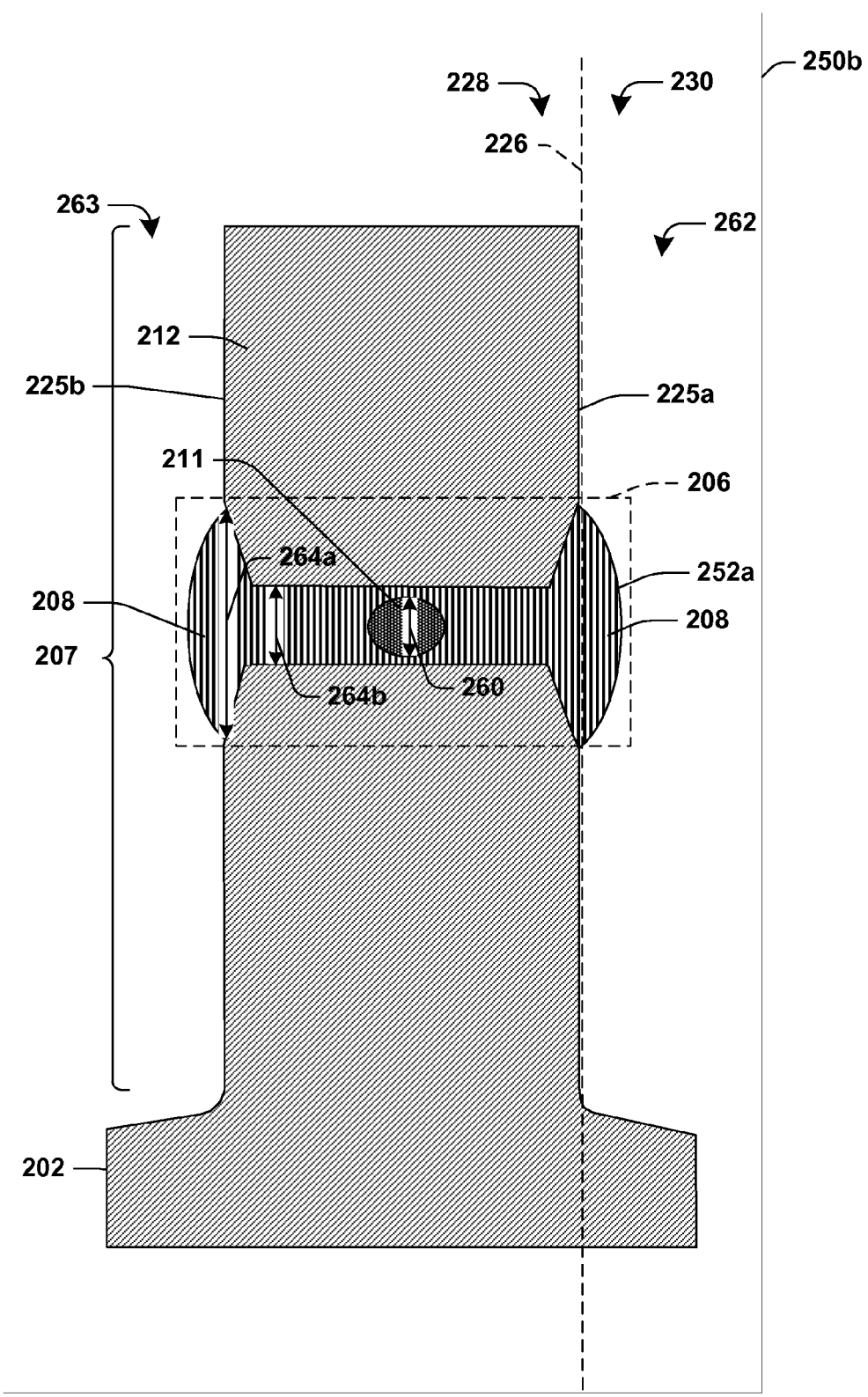
FIG. 13 is an illustration of a semiconductor device, in accordance with some embodiments.

According to some embodiments, FIG. 13 illustrates a second magnified fin 250b, the second magnified fin 250b illustrates an embodiment of the fin 207 encompassed by the dashed box 250 illustrated in FIG. 10. In some embodiments, the doped region 206 comprises a first doped area 211 and a dielectric 208. In some embodiments, the fin 207 has a first wall 225 extending along a first plane 226 on a first side 262 of the fin 207. In some embodiments, the dielectric 208 comprises oxide and at least one of silicon or germanium. In some embodiments, the first doped area 211 comprises at least one of silicon or germanium. In some embodiments, the second magnified fin 250b comprises the dielectric 208 surrounding the first doped area 211. In some embodiments, a first outer wall 252a of the dielectric 208 is on second side 230 of the first plane 226. In some embodiments, the first outer wall 252a of the dielectric 208 is convex. In some embodiments, the first doped area 211 is at least one of circular, triangular, or other polygonal structure. In some embodiments, a second side 263 the fin 207 has substantially the same composition as or is substantially symmetrical with the first side 262 of the fin 207. In some embodiments, the dielectric 208 has a first dielectric height 264a and a second dielectric height 264b. In some embodiments, the first dielectric height 264a is measured from a top most point of the dielectric 208 to a bottom most point of the dielectric 208, where the top most point of the dielectric 208 and the bottom most point of the dielectric 208 are substantially on at least one of the first wall 225a or a second wall 225b of the fin 207. In some embodiments, the second dielectric height 264b is measured from a top surface of the dielectric 208 to a bottom surface of the dielectric on the first side 228 of the first plane 226. In some embodiments, the first dielectric height 264a is greater than the second dielectric height 264b. In some embodiments, the first doped area 211 has a doped area height 260, the doped area height less than the first dielectric height 264a and the second dielectric height 264b.

Figure 14:
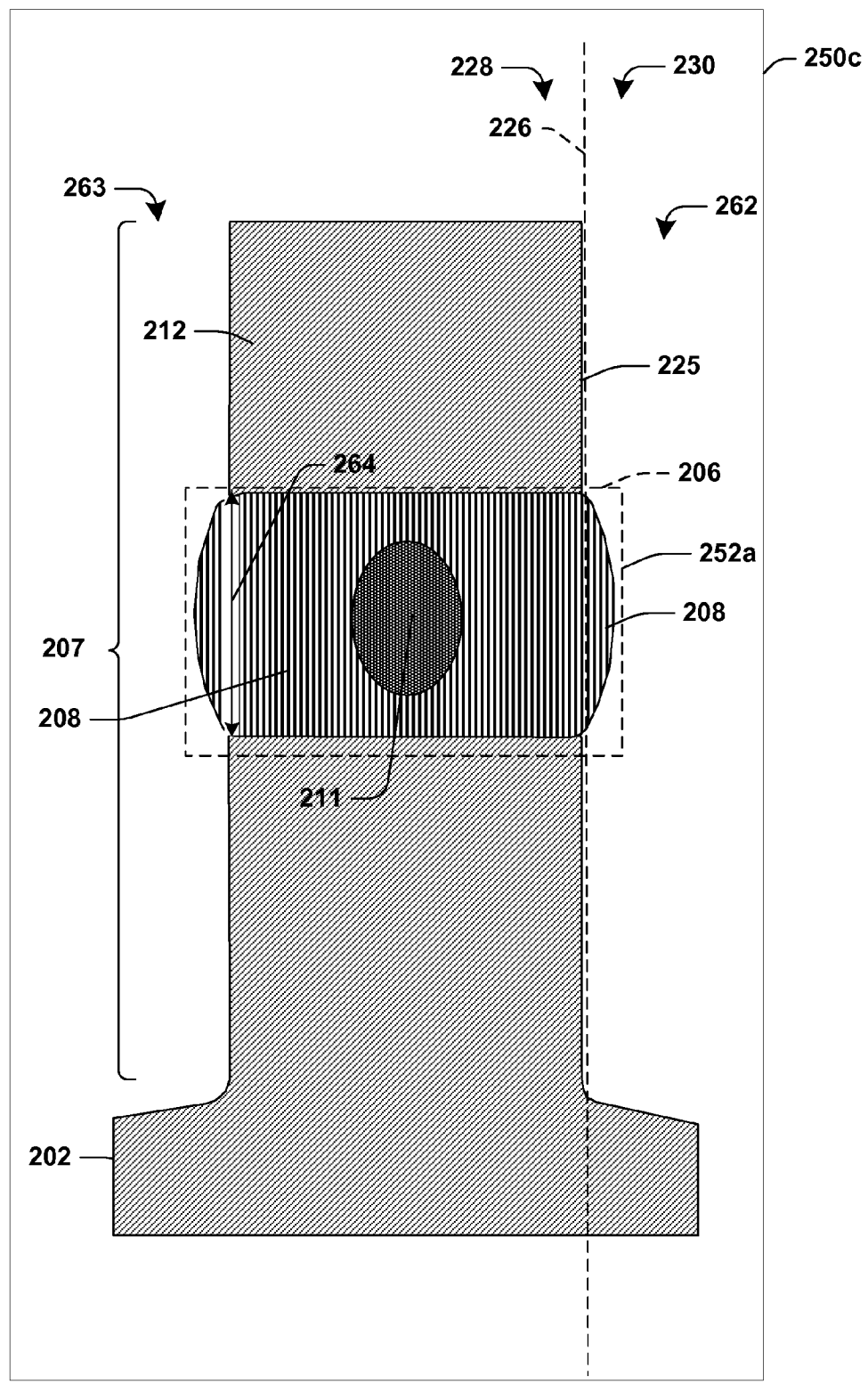
FIG. 14 is an illustration of a semiconductor device, in accordance with some embodiments.

According to some embodiments, FIG. 14 illustrates a third magnified fin 250c, the third magnified fin 250c illustrates an embodiment of the fin 207 encompassed by the dashed box 250 illustrated in FIG. 10. In some embodiments, the third magnified fin 250c has substantially the same composition as the second magnified fin 250b, as illustrated in FIG. 13, except that the dielectric 208 has a uniform height, substantially equal to the first dielectric height 264a.

Figure 15:
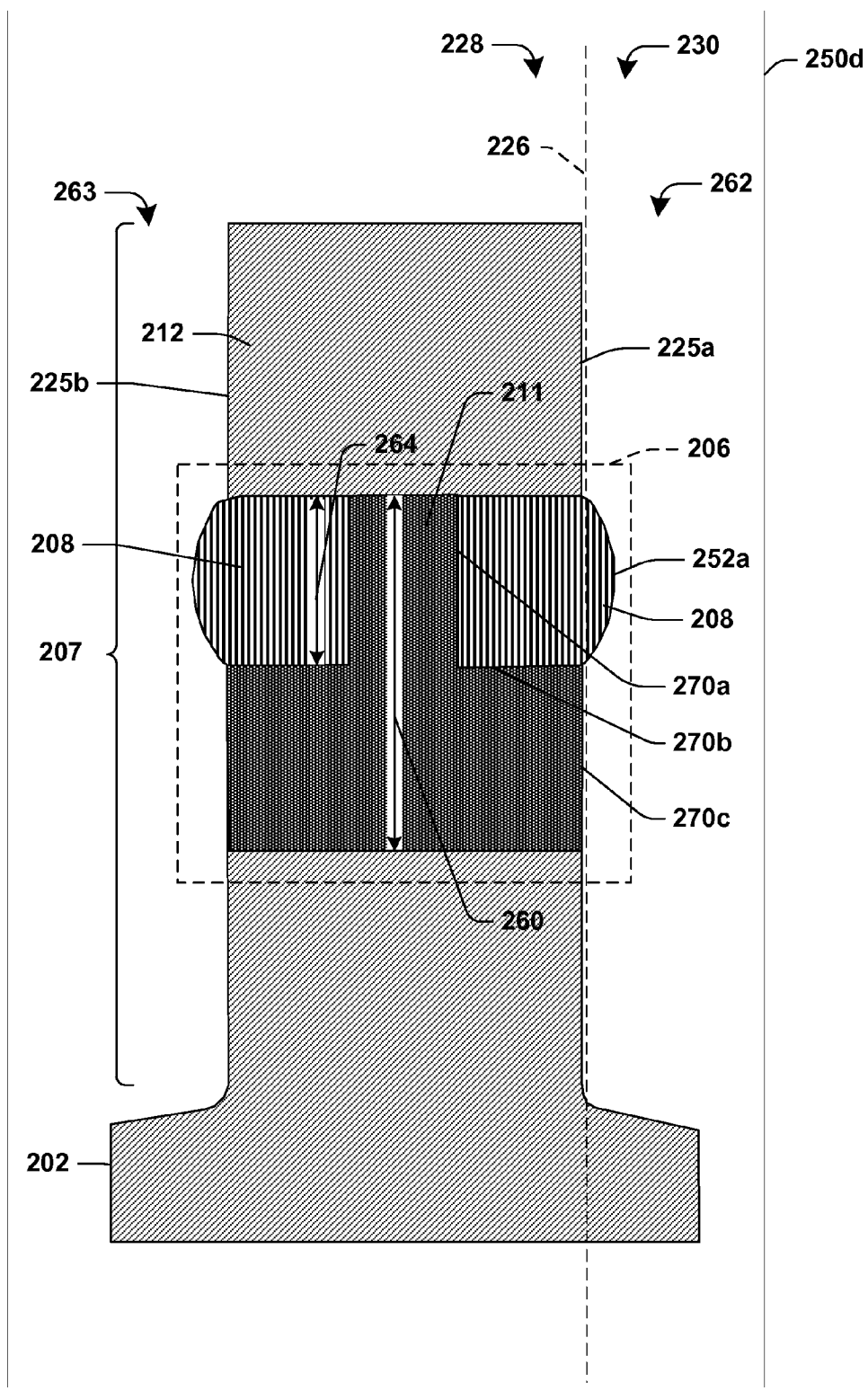
FIG. 15 is an illustration of a semiconductor device, in accordance with some embodiments.

According to some embodiments, FIG. 15 illustrates a fourth magnified fin 250d, the fourth magnified fin 250d illustrates an embodiments of the fin 207 encompassed by the dashed box 250 illustrated in FIG. 10. In some embodiments, the doped region 206 comprises a first doped area 211 and a dielectric 208. In some embodiments, the fin 207 has the first wall 225a of the fin 207 extending along the first plane 226 on a first side 262 of the fin 207. In some embodiments, the dielectric 208 comprises oxide and at least one of silicon or germanium. In some embodiments, the first doped area 211 comprises at least one of silicon or germanium. In some embodiments, the fourth magnified fin 250d comprises the dielectric 208 covering a first surface 270a and a second surface 270b of the first doped area 211 where neither the first surface 270a nor the second surface 270b are along the first wall 225a or a second wall 225b of the fin 207. The dielectric 208 does not, however, cover a third surface 270c of the first doped area 211 where the third surface 270c is along the first wall 225a. In some embodiments, a first outer wall 252a of the dielectric 208 is on a second side 230 of the first plane 226. In some embodiments, the first outer wall 252a of the dielectric 208 is convex. In some embodiments, the dielectric 208 has a dielectric height 264, the dielectric height 264 measured from a top most point of the dielectric 208 to a bottom most point of the dielectric 208. In some embodiments, the first doped area 211 has a doped area height 260, the doped area height 260 greater than the dielectric height 264. In some embodiments, a second side 263 the doped region 206 has substantially the same composition as or is substantially symmetrical with the first side 262 of the fin 207.

According to some embodiments, a semiconductor device comprises a fin, the fin comprising at least one of silicon, germanium or oxide, an epitaxial (Epi) cap over the fin, the Epi cap comprising silicon and phosphorus, and a barrier between the fin and the Epi cap, the barrier comprising carbon and at least one of silicon or phosphorus.

According to some embodiments, a method of forming a semiconductor device, comprises forming a barrier over a fin, the barrier comprising carbon, and forming an epitaxial (Epi) cap over the barrier, such that the barrier is between the fin and the Epi cap. In some embodiments, the Epi cap comprises phosphorus.

According to some embodiments, a semiconductor device comprises a fin, the fin comprising at least one of silicon, germanium or oxide, an epitaxial (Epi) cap over the fin, the Epi cap comprising silicon and phosphorus, and a barrier between the fin and the Epi cap, the barrier comprising carbon and at least one of silicon or phosphorous.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
an epitaxial (Epi) cap vertically overlapping a fin, the Epi cap comprising phosphorus; and
a barrier between the fin and the Epi cap, wherein:
the barrier comprises carbon,
there is no interface between a bottom surface of the Epi cap and a top surface of the fin underlying the Epi cap due to the barrier, and
the barrier comprises:
a first tapered sidewall extending from a top surface of the fin to a bottom of the barrier and having a first slope, and
a second tapered sidewall extending from the top surface of the fin to the bottom of the barrier and having a second slope opposite the first slope.

2. The semiconductor device of claim 1, the Epi cap comprising at least one of a source or a drain.

3. The semiconductor device of claim 1, the barrier comprising at least one of silicon or phosphorus.

4. The semiconductor device of claim 1, the barrier comprising a first barrier layer and a second barrier layer.

5. The semiconductor device of claim 4, the first barrier layer over the second barrier layer, such that the second barrier layer is in contact with the fin and the first barrier layer is in contact with the Epi cap.

6. The semiconductor device of claim 5, the first barrier layer comprising silicon and carbon and the second barrier layer comprising silicon, carbon and phosphorus.

7. The semiconductor device of claim 1, the barrier having a carbon concentration between about 0.2% to about 3%.

8. The semiconductor device of claim 1, the barrier comprising phosphorus.

9. The semiconductor device of claim 1, the barrier comprising silicon.

10. The semiconductor device of claim 1, the barrier having a thickness between about 2 nm to about 25 nm.

11. The semiconductor device of claim 1, the fin comprising at least one of silicon, germanium or oxide.

12. The semiconductor device of claim 1, a gate adjacent the Epi cap and over a channel portion of the fin.

13. A semiconductor device, comprising:
a fin comprising a silicon germanium region and a silicon germanium oxide region in contact with sidewalls of the silicon germanium region;
an epitaxial (Epi) cap overlying the silicon germanium region and the silicon germanium oxide region of the fin, the Epi cap comprising silicon and phosphorus; and
a barrier in contact with the fin and between the fin and the Epi cap, the barrier comprising:
a first barrier layer in contact with a top surface of the fin and comprising a first material composition; and
a second barrier layer in contact with a top surface of the first barrier layer and comprising a second material composition different than the first material composition.

14. The semiconductor device of claim 13, the second barrier layer comprising carbon, silicon, and phosphorus.

* * * * *